United States Patent

Birnie

Patent Number: 5,949,709
Date of Patent: Sep. 7, 1999

[54] ELECTRICALLY PROGRAMMABLE MEMORY, METHOD OF PROGRAMMING AND METHOD OF READING

[75] Inventor: Andrew Birnie, Glasgow, United Kingdom

[73] Assignee: Motorola, Inc., Schaumburg, Ill.

[21] Appl. No.: 09/029,598

[22] PCT Filed: Aug. 30, 1996

[86] PCT No.: PCT/EP96/03813

§ 371 Date: Jun. 23, 1998

§ 102(e) Date: Jun. 23, 1998

[87] PCT Pub. No.: WO97/08706

PCT Pub. Date: Mar. 6, 1997

[30] Foreign Application Priority Data

Aug. 31, 1995 [GB] United Kingdom .................. 9517759

[51] Int. Cl.⁶ .................................................. G11C 11/34
[52] U.S. Cl. ............................... 365/185.03; 365/185.21; 365/185.19; 365/185.18
[58] Field of Search ......................... 365/185.03, 185.21, 365/185.19, 185.18

[56] References Cited

U.S. PATENT DOCUMENTS 5,218,571  6/1993  Norris ................................. 365/189.09
5,629,890  5/1997  Engh .................................. 365/185.03

*Primary Examiner*—David Nelms
*Assistant Examiner*—VanThu Nguyen
*Attorney, Agent, or Firm*—Rennie William Dover

[57] ABSTRACT

An electrically programmable memory comprising: a floating gate FET cell (10) having: a drain electrode, and a source electrode; means for applying to the drain electrode a first voltage ($V_{PP}$) for a programming time ($T_P$); means for applying to the source electrode a second voltage ($V_{ML}$) for the programming time, the second voltage being variable between more than two levels so as to determine the quantity of charge induced on the floating gate and thereby to determine the multi-level value programmed into the cell substantially independently of the programming time. A multi-level value programmed into the cell is sensed by placing an iteratively or dynamically varying voltage on the source electrode, and current flow in the cell is sensed to determine the voltage on the floating gate.

10 Claims, 2 Drawing Sheets

ELECTRICALLY PROGRAMMABLE MEMORY, METHOD OF PROGRAMMING AND METHOD OF READING

FIELD OF THE INVENTION

This invention relates to an electrically programmable memory, and particularly, though not exclusively, to an electrically erasable programmable read-only memory (EEPROM or E²PROM).

BACKGROUND OF THE INVENTION

In the field of memories generally and E²PROMs in particular there is constant demand for shrinking geometries, increasing densities and hence reducing die. costs. However, because E²PROM involves high voltages, certain physical breakdown effects limit the scaling of the E²PROM cell so it cannot be shrunk as per standard 5 V logic gates.

Conventionally, E²PROM memory cells have stored binary values, i.e. either a '0' or a '1'. In efforts to increase storage density, two schemes have been proposed for multilevel cell systems:

Firstly it has been proposed to use a large double-polysilicon cell with a number of different sized control gates, allowing the programming of multi-level values into the cell by varying the coupling capacitance ratio of the cell. However, this multi-level scheme has the drawback that it requires a very large cell, hence producing no overall density benefits.

Secondly it has been proposed to program different values into a standard Flash EEPROM cell using a number of short programming bursts, the number of bursts controlling the threshold voltage of the cell, i.e. the value to be programmed; a complex multi-reference-level comparator must be used as a sense amplifier. However, this multi-level scheme has the drawback that, although the cell itself may be small, it requires a complex sense amplifier scheme with many accurate voltage levels being necessary.

SUMMARY OF THE INVENTION

In accordance a first aspect of the invention there is provided an electrically programmable memory as claimed in claim 1.

In accordance with a second aspect of the invention there is provided a method of programming an electrically programmable memory as claimed in claim 7.

In accordance with a third aspect of the invention there is provided a method of reading an electrically programmed memory as claimed in claim 8.

BRIEF DESCRIPTION OF THE DRAWINGS

One E²PROM cell in accordance with a preferred embodiment of the present invention will now be described, by way of example only, with reference to the accompanying drawings, in which.

DETAILED DESCRIPTION OF A PREFERRED EMBODIMENT

Figure 1:
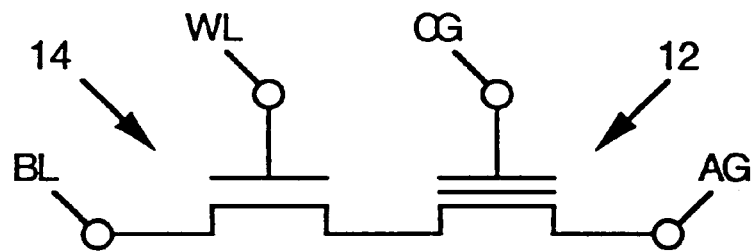
FIG. 1 is a schematic circuit diagram of an E²PROM cell used in the present invention.

Referring firstly to FIG. 1, in a typical standard E²PROM cell array, an E²PROM cell 10 includes a field-effect transistor metal-oxide-semiconductor (FETMOS) double-polysilicon structure 12 with a floating gate as the charge storage region. In order to allow the cell 10 to be individually addressed in the array, the cell also includes an addressing FETMOS transistor 14. The source electrode of the transistor 12 is connected to an "array ground" node AG, and the gate electrode of the transistor 12 is connected to a "control gate" node CG. The drain electrode of the transistor 12 is connected to the source electrode of the transistor 14. The drain electrode of the transistor 14 is connected to a "bit line" node BL, and the gate electrode of the transistor 14 is connected to a "word/row line" node WL.

Figure 2:
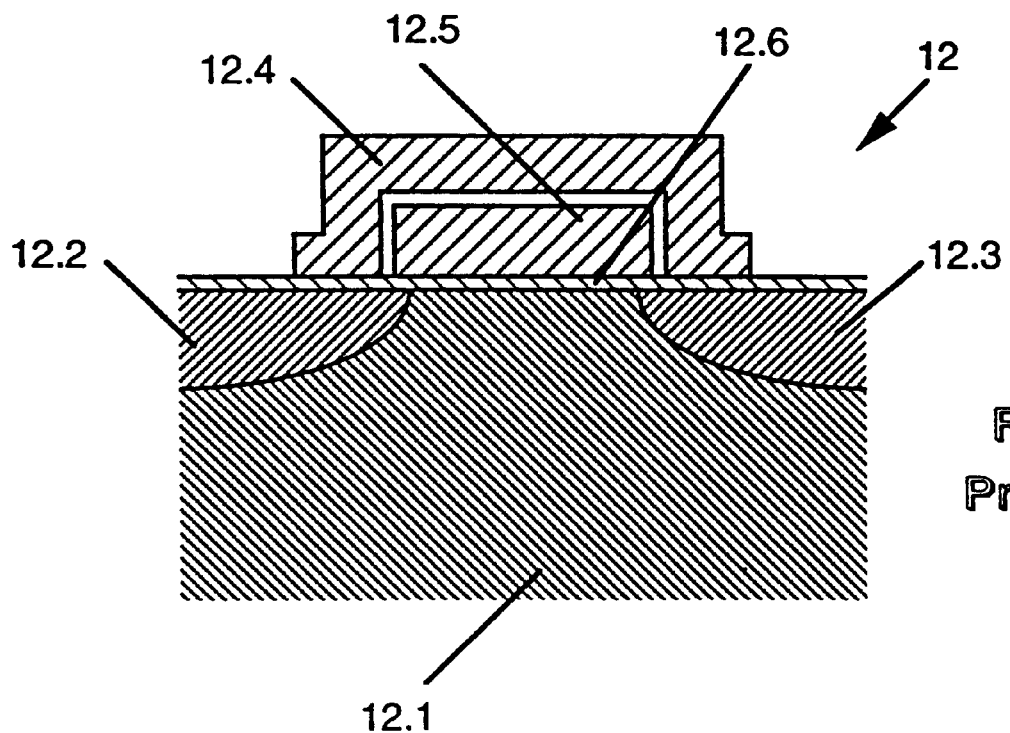
FIG. 2 is a cross-sectional view of part of the cell of FIG. 1.

Referring now particularly to FIG. 2, the transistor 12 has a substrate region 12.1 of p- type silicon, and drain and source regions 12.2, 12.3 of n+ type silicon. The transistor 12 also has a floating gate 12.4 of a first polysilicon material overlaid by a control gate 12.5 of a second polysilicon material. The polysilicon gates 12.4 and 12.5 are separated from the substrate by a thin oxide layer 12.6 having a thickness of approximately 10 nm.

The polarity of the charge on the floating gate 12.4 of the transistor 12 dictates the operation mode of the E²PROM cell as a transistor, i.e. enhancement or depletion mode. The charge on the floating gate is controlled by transferring electrons to/from the gate through the thin oxide layer 12.6 by the quantum mechanical process known as Fowler Nordheim (FN) tunnelling. However, this process requires a relatively high voltage, called $V_{PP}$ (typically greater than 15 V), to induce this tunnelling.

The programming of such an E²PROM cell is inherently self-limiting. During programming, $V_{PP}$ (>15 V) is put on the BL and WL nodes, with a voltage somewhat less than $V_{PP}$ being applied to the CG node (e.g., $V_{SS}$—typically 0 V, or $V_{DD}$—typically between 5.5 V and 2.7 V or perhaps even lower). Electrons are pulled off the floating gate leaving it positively charged, i.e. at a negative threshold. During the programming event the electrons will not be pulled off the floating gate indefinitely but will be limited by the cell itself. As the floating gate becomes more positively charged (depleted of electrons), the situation will arise where $V_{GS}$ (the floating gate-source voltage) is greater than the NMOS threshold voltage (~0.7 V). Under this condition, the cell will act as an 'on' transistor and will conduct. This will draw current from the BL node at $V_{PP}$ and hence will reduce the voltage at the node BL below the level necessary for FN tunnelling, thus switching off the programming.

Figure 3:
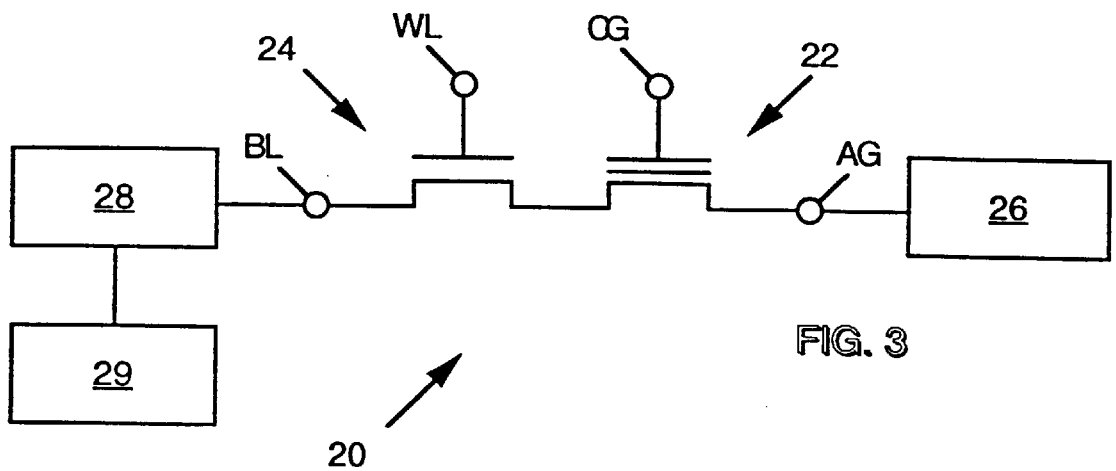
FIG. 3 is a schematic circuit diagram of an E²PROM cell used in the present invention and incorporating additional circuitry for reading programmed cell data using a static, iterative sensing scheme.
Figure 4:
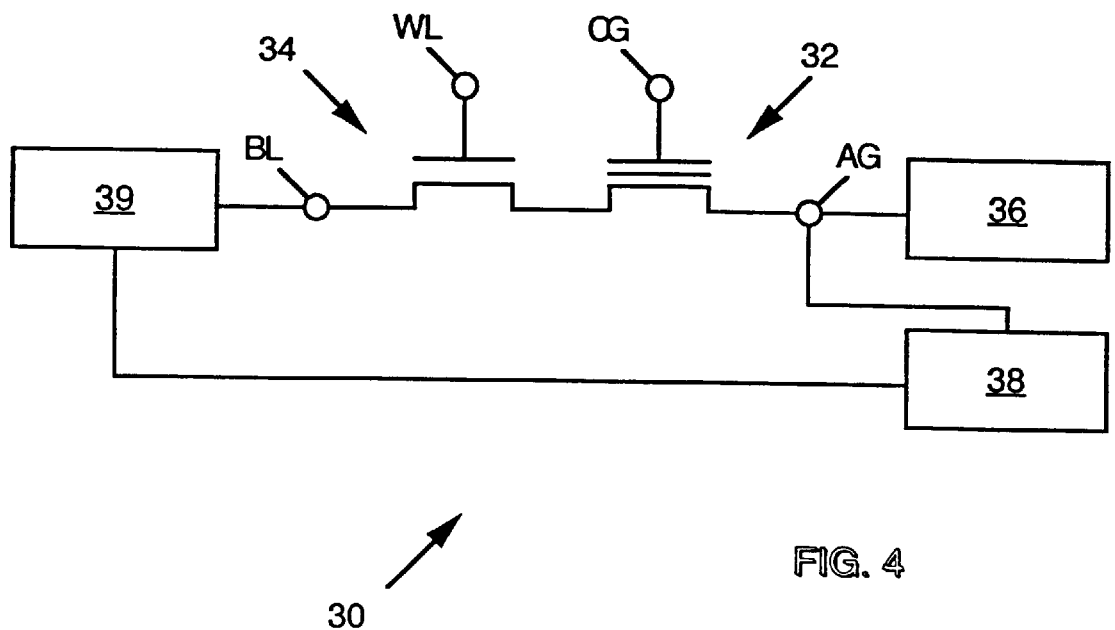
FIG. 4 is a schematic circuit diagram of an E²PROM cell used in the present invention and incorporating additional circuitry for reading programmed cell data using a dynamic sensing scheme.

Referring now to FIG. 3 and FIG. 4, the E²PROM cells 20 and 30 incorporating the present invention utilise this self-limiting mechanism to program different voltage levels into the floating gate. Any desired number of different levels can be chosen, but in the present examples, for the sake of simplicity, the number of different levels which the cell 10 can store is chosen as four, i.e. the cells 20 and 30 can store distinct levels corresponding to data values '0', '1 ', '2' and '3'. Thus, in this example, the cells 20 and 30 can each have four different thresholds.

Referring now particularly to FIG. 3, the multi-level E²PROM cell 20 is similar to the above-described prior art cell 10. The cell 20 has a double-polysilicon, floating gate FETMOS transistor 22 (analogous to the transistor 12 of the cell 10) for charge storage and a FETMOS transistor 24 (analogous to the transistor 14 of the cell 10) for addressing. Additionally, as will be explained below, the cell 20 has a selectable reference voltage source 26 for applying a reference voltage of a selectable multi-level value to the node AG of the charge storage transistor 22.

The cell 20 is programmed to a multi-level value as follows.

The threshold voltage of data state '3' is chosen to be the most positive (i.e., negative floating gate). This corresponds to an erased cell (erased by putting $V_{PP}$ on the nodes CG and WL, with $V_{SS}$ on the nodes AG and BL). Data state '0' corresponds to a programmed cell with a threshold voltage less than that of data state '3', while the threshold voltages of data states '1' and '2' are between the threshold voltages of data states '3' and '0': the threshold voltage of data state '0' being less than that of data state '1', which is less than that of data state '2', which is less than that of data state '3'. This is achieved by varying the voltage $V_{ML}$ on the AG node during programming: for example, to program a '0' state, an AG node voltage $V_{ML}$ of 10 V is used which will cause the cell to be programmed up to a high floating gate voltage (10 V); a '1' state uses 7 V on the AG node; and a '2' state uses 3 V on the AG node. It will be realised that the wide bands between the different threshold values provide wide margins between the different data states.

It will be understood that, since the programming of the cell 20 relies on the self-limiting effect described above, once the desired voltage has been applied on the AG node, the programming of the cell with the desired multi-level value occurs independently of the programming time $T_P$ (provided, of course, that the programming time $T_P$ is sufficient to allow the programmed value to stabilise at the desired level).

It will be understood that the detailed structure of the selectable reference voltage source 26 is not important to the present invention, and it will be within the ordinary skill of a typical integrated circuit designer to decide upon a particular reference voltage source for producing the desired voltage levels for application to the node AG.

In the present example, the sensing/reading of the multi-level E²PROM cell 20 involves two steps: firstly pre-charging the BL node to one volt greater than the threshold to be sensed, and secondly opening the cell by applying $V_{DD}$ (typically approximately ?V) to the WL node and $V_{SS}$ to the CG node., Two alternative sensing schemes are envisaged—one static and one dynamic although both relying on the same principal. Both schemes place varying voltages on the AG node during the read cycle, and sense current flow in the cell to determine the voltage on the floating gate.

In both of the schemes the voltage on the BL node may kept constant or may be made to track the varying voltage on the AG node (e.g., at a voltage equal to or, say, 1 V above or below that applied to the AG node).

Referring firstly to FIG. 3, consider the cell 20 programmed to data state '1' (i.e. programmed with 7 V on the AG node in the above example). In the static sensing scheme, an iterative sensing method is performed. 3 V is initially placed on the AG node and the BL node is pre-charged to 4 V. Since $V_{GS} > V_{TN}$ the cell will conduct and the pre-charged BL node will be discharged. A sense amplifier 28 monitors and detects this current flow and a value of '2' is stored in a weighted data latch 29 as the possible value programmed in the cell 20.

This procedure is then repeated with AG=7 V, which will also cause current flow (since $V_{GS} > V_{TN}$), hence a value of '1' is stored in the data latch 29 as the possible value programmed in the cell 20. The procedure is then be repeated with AG=10 V, but here since $V_{GS} < V_{TN}$ there will be no current flow. So, considering the sense amplifier output at each step of the iterative sensing, the result is that the cell is concluded to have been programmed with a value of '1'.

For a '3' data state (i.e. erased), only the first sensing with AG=3 V will be necessary, since there will never be any current flow for an erased cell. For a '0' data state, there will be current flow with AG=3 V, 7 V and 10 V.

Referring now to FIG. 4, the multi-level E²PROM cell 30 is similar to the above-described multi-level E²PROM cell 20. The cell 30 has a double-polysilicon, floating gate FETMOS transistor 32 (analogous to the transistor 22 of the cell 20) for charge storage, a FETMOS transistor 34 (analogous to the transistor 24 of the cell 20) for addressing, and a selectable reference voltage source 36 (analogous to the selectable reference voltage source 26 of the cell 20) for applying a reference voltage of a selectable multi-level value to the node AG of the charge storage transistor 32.

However, in the multi-level E²PROM cell 30, the static, iterative sensing scheme described above in relation to the multi-level E²PROM cell 20 of FIG. 3 is made dynamic. The multi-level E²PROM cell 30 includes a ramp voltage generator 38 for applying a ramp voltage to the AG node of the programmed charge storage transistor 32, and a sense amplifier 39 for sensing current flow in the cell.

Dynamic sensing in the multi-level E²PROM cell 30 is performed as follows.

The WL node is opened, and the ramp voltage generator 38 applies to the AG node a voltage which ramps from 3 V to 10 V, waiting for current to flow in the cell. As the voltage ramps up, the sense amplifier 39 monitors and detects the current flow when it occurs. When current flow is detected, the level of the applied AG voltage is measured. This corresponds to the threshold at which the cell was programmed and hence the data state of the cell.

It will be appreciated that the two alternative sensing schemes described above each have their own advantages and disadvantages: the static, iterative sensing scheme as described with respect to FIG. 3 requires only a simple sense amplifier 28, but requires fast clocking since three read cycles are necessary to determine the data state. The dynamic sensing scheme as described with respect to FIG. 4 is quicker, but will require a more complex sense amplifier 39.

It will be understood that, as with the selectable voltage generator 18 described above, the detailed structures of the sense amplifier 28, the ramp voltage generator 38 and the sense amplifier 39 are not important to the present invention, and it will be within the ordinary skill of a typical integrated circuit designer to decide upon particular structures for these routine functions to be performed in the described manner.

Thus, it will be appreciated that this invention has the ability to increase EEPROM cell density dramatically without the need for very accurate reference voltages or complex analog circuitry.

It will also be appreciated that this since invention makes use of a robust self-limiting E²PROM programming mechanism to determine variable cell thresholds (i.e. data states), it inherently provides tight cell threshold distributions and repeatable performance across the parts write/erase endurance lifetime.

It will, of course also be appreciated that although in the above example a multi-level E²PROM cell was described, the invention is not limited to an E²PROM cell, but is generally applicable to any electrically programmable memory, such as 'flash' memory, that uses Fowler Nordheim (FN) tunnelling as a charge transfer mechanism.

I claim:

1. An electrically programmable memory comprising:
    a floating gate FET cell having:
        a drain electrode, and
        a source electrode;
    means for applying to one of the drain and source electrodes a first relatively high voltage for a programming time;
    means for applying to the other of the drain and source electrodes a second voltage less than the first voltage for the programming time, the second voltage being variable between more than two levels so as to determine the quantity of charge induced on the floating gate FET cell and thereby to determine a multi-level value programmed into the cell substantially independently of the programming time.

2. An electrically programmable memory as claimed in claim 1 further comprising a thin insulating layer arranged between the floating gate and the remainder of the FET.

3. An electrically programmable memory as claimed in claim 1 wherein the floating gate comprises a polysilicon material.

4. An electrically programmable memory as claimed in claim 1 wherein the one of the drain and source electrodes is a drain electrode.

5. An electrically programmable memory as claimed in claim 1 wherein the other of the drain and source electrodes is a source electrode.

6. An electrically programmable memory as claimed in any preceding claim wherein the memory is an electrically e rasable read-only memory (E²PROM).

7. A method of programming an electrically programmable memory comprising:
    a floating gate FET cell having:
        a drain electrode, and
        a source electrode; the method comprising:
    applying to one of the drain and source electrodes a first relatively high voltage for a programming time; and
    applying to the other of the drain and source electrodes a second voltage less than the first voltage for the programming time, the second voltage being variable between more than two levels so as to determine the quantity of charge induced on the floating gate FET cell and thereby to determine a multi-level value programmed into the cell substantially independently of the programming time.

8. A method of reading an electrically programmed memory comprising:
    a floating gate FET cell having:
        a drain electrode; and
        a source electrode,
    the method comprising:
    applying to one of the drain and source electrodes a third voltage; and
    applying to the other of the drain and source electrodes a fourth, varying voltage, less than the third voltage; and
    sensing current flow in the cell so as to determine a multi-level value programmed into the cell.

9. The method of claim 8 wherein the step of applying the fourth, varying voltage comprises applying a ramping voltage until current flow greater than a predetermined threshold occurs in the cell.

10. The method of claim 8 wherein the step of applying the fourth, varying voltage comprises applying a voltage having multiple levels in sequence and sensing whether current flow in the cell at each sequential level is greater than a predetermined threshold until the multi-level value programmed into the cell can be determined.

* * * * *